US006892800B2

(12) United States Patent
Mok

(10) Patent No.: US 6,892,800 B2
(45) Date of Patent: May 17, 2005

(54) OMNIDIRECTIONAL FAN-HEATSINKS

(75) Inventor: Lawrence Shungwei Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/335,123

(22) Filed: Dec. 31, 2002

(65) Prior Publication Data

US 2004/0129409 A1 Jul. 8, 2004

(51) Int. Cl.[7] .............................................. H05K 7/020
(52) U.S. Cl. .................................. 165/104.33; 165/121
(58) Field of Search ............................... 165/80.3, 185, 165/121, 104.33; 361/697, 704, 710; 257/719, 722

(56) References Cited

U.S. PATENT DOCUMENTS

| 5,309,983 | A |   | 5/1994  | Bailey ........................ 165/80.3 |
| 5,502,619 | A |   | 3/1996  | Wang ......................... 361/697 |
| 5,583,746 | A | * | 12/1996 | Wang ......................... 361/697 |
| 5,584,339 | A |   | 12/1996 | Hong ......................... 165/80.3 |
| 5,785,116 | A |   | 7/1998  | Wagner ....................... 165/80.3 |
| 5,896,917 | A | * | 4/1999  | Lemont et al. ............ 165/80.3 |
| 6,125,920 | A | * | 10/2000 | Herbert ...................... 165/80.3 |
| 6,625,021 | B1| * | 9/2003  | Lofland et al. ............. 361/697 |
| 2002/0093255 | A1 | * | 7/2002 | Matsumoto .................. 310/64 |

\* cited by examiner

*Primary Examiner*—Allen J. Flanigan
(74) *Attorney, Agent, or Firm*—Thomas A. Beck; Daniel P. Morris

(57) ABSTRACT

The invention provides a structural principle wherein a combination fan-heatsink type cooling device transfers a large amount of heat into an ambient while producing minimal acoustic noise. The fan-heatsink has top and bottom cover members with a central power shaft between them, the shaft has fins that rotate around the shaft between the covers to move ambient. The ambient enters the fan-heatsink through inlets through the covers near the central power shaft and is forced out through louvers that make up the peripheral of the fan-heatsink housing. The fan-heatsink cooling device is positioned so that heat radiating from the heat source such as a chip enters the housing through the inlets near the central shaft and heat pipes are arranged to carry heat from the chip source to and through the louvers so that the ambient forced through the louvers absorbs heat transferred to the louvers at the place where it is immediately carried out of the fan-heatsink structure.

6 Claims, 3 Drawing Sheets

OMNIDIRECTIONAL FAN-HEATSINKS

FIELD OF THE INVENTION

The invention is in the field of heat transfer and cooling of electrical apparatus such as semiconductor chips used in the computer and telecommunication types of equipment, and in particular to the solving of heat dissipation problems in devices such as computers where size, weight, and power consumption are constrained.

BACKGROUND AND RELATION TO THE PRIOR ART

The power consumption of computers, especially the power consumption of the central processing units (CPU)s used in them is increasing. As examples, the total power of a laptop computer in a few years has increased from about 10 watts to now around 50 watts, and that of a desktop computer has increased form 300 watts to about 500 watts. The CPU portion of the overall power has increased from about 2 to about 18 watts and is expected in the future to approach 40 watts in laptop computers and 30 to 150 watts in desktop computers. Most of the CPU power will have to be dissipated and the efficiency of the dissipation is becoming a critical consideration.

There has been some effort in the art using combinations of fans, fins and heat pipe thermal conveyance that have produced systems where the elements in working and being positioned separately, have not achieved high efficiency. There is a need developing in the art for a heat transfer system where all the elements work bring interdependency and efficiency to the system.

SUMMARY OF THE INVENTION

The invention provides a structural principle wherein a combination fan-heatsink type cooling device transfers a large amount of heat into an ambient while producing minimal acoustic noise. The fan-heatsink has top and bottom cover members with an impeller made up of a central power shaft extending between and through the cover members them, the shaft has fins that rotate around the shaft between the covers to move ambient. The ambient enters the fan-heatsink through inlets through the covers near the central power shaft and is forced out through louvers that make up the peripheral of the fan-heatsink housing. The fan-heatsink cooling device is positioned so that heat radiating from the heat source such as a chip enters the housing through the inlets near the central shaft and heat pipes are arranged to carry heat from the chip source to and through the louvers so that the ambient forced through the louvers absorbs heat transferred to the louvers at the place where it is immediately carried out of the fan-heatsink structure.

BRIEF DESCRIPTION OF THE DRAWINGS

The invention involves interrelated features that are shown through four perspective depictions in FIGS. 1–4 in which.

DESCRIPTION OF THE INVENTION

Figure 1:
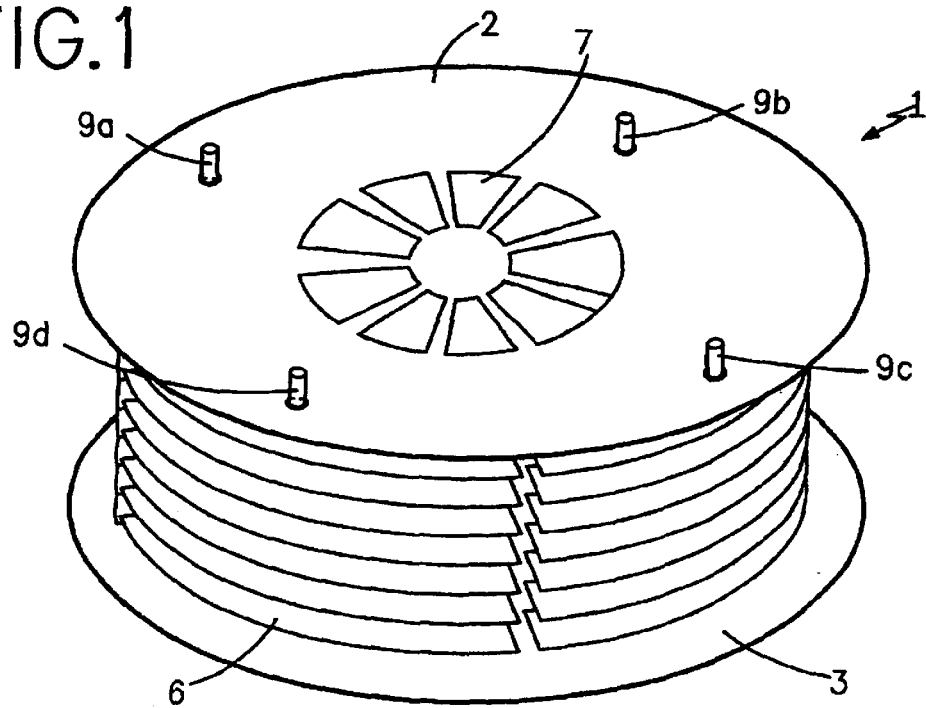
FIG. 1 is a perspective depiction of the omnidirectional fan-heats ink assembly showing the covers, the shaft, the ambient inlets and portions of the heatpipes.
Figure 2:
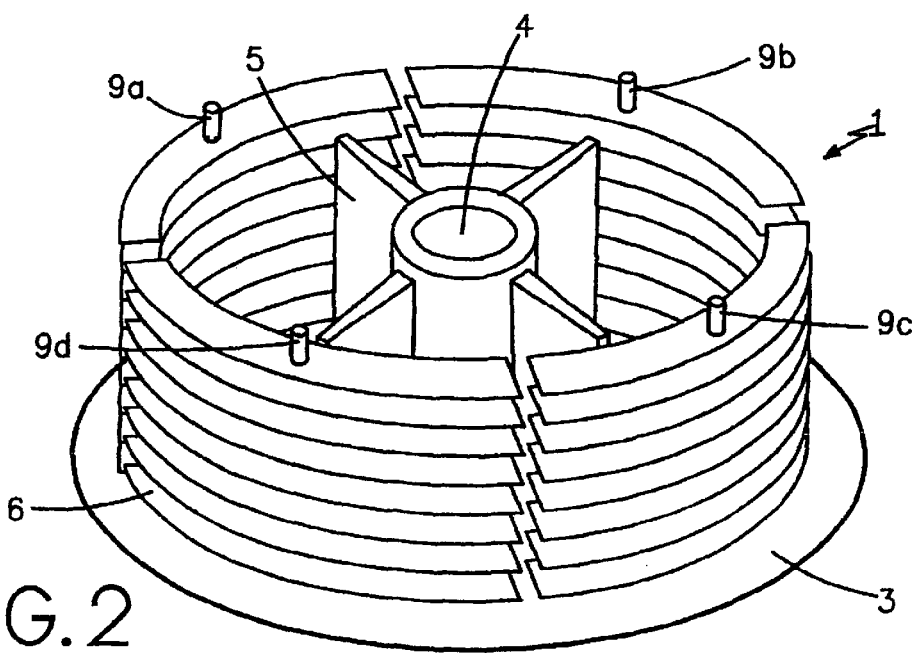
FIG. 2 is an exploded perspective depiction of the omnidirectional fan-heatsink assembly with the upper cover off revealing the fan or impeller inside the louvered housing.
Figure 3:
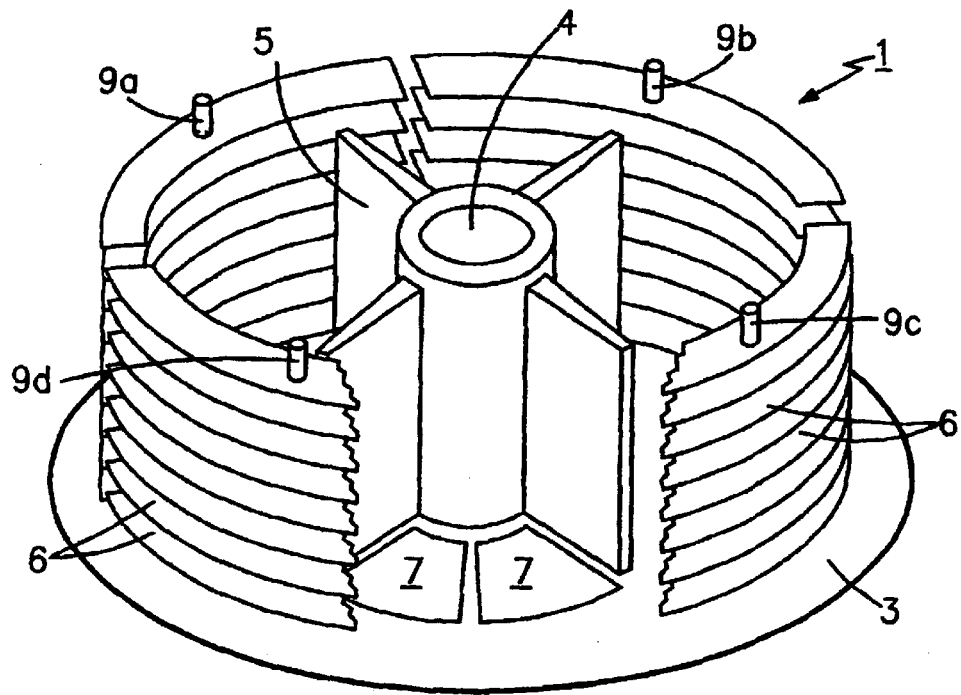
FIG. 3 is a further exploded perspective depiction of the omnidirectional fan-heatsink assembly with a cover off revealing the full height of the fin or impeller blades and the lower ambient inlets inside a broken away portion of the louvered housing.
Figure 4:
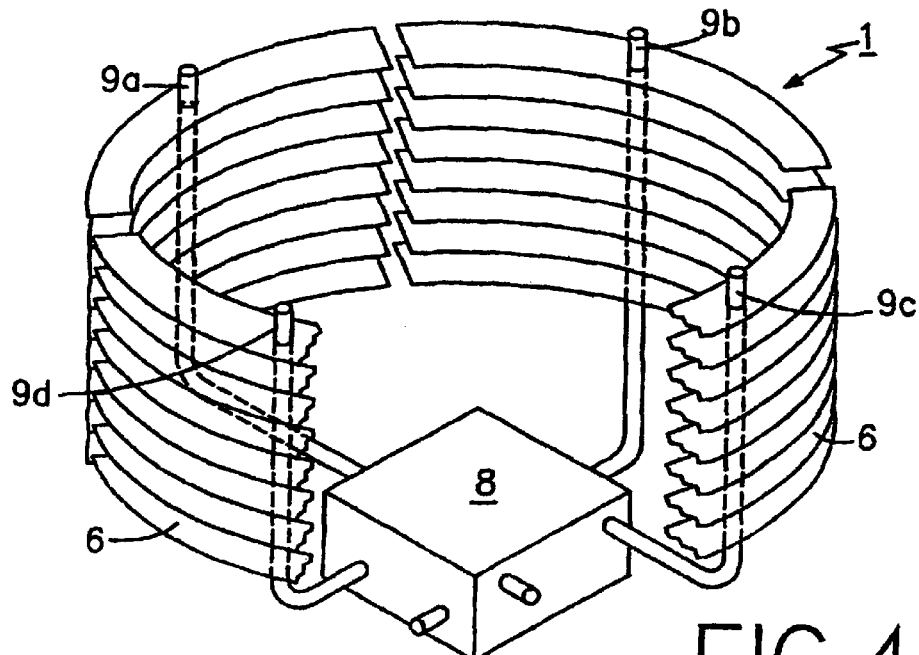
FIG. 4 is a further exploded perspective depiction of the louver portion of the fan-heatsink assembly exposing through a break away portion of the perpheral louvers, the chip and heat pipe assembly.

Referring to FIGS. 1–4 together since all elements are not equally visible in each Figure and wherein like reference numerals are used where appropriate; in accordance with the invention the structural principle of the fan-heatsink 1 may be viewed as consisting of top 2 and bottom 3 cover members with a central power shaft 4 through them, the shaft 4 has fins 5 visible in FIGS. 2 and 3 attached so as to rotate around the shaft between the covers 2 and 3 within a housing of louvered heat exchangers 6 to move an ambient heat bearing gas such as air. The ambient enters the fan-heatsink 1 via inlets 7 through the covers 2 and 3 near the central power shaft 4 and is forced out through the louvers 6 that make up the periphery of the fan-heatsink housing. A heat pipe transfer capability is provided involving a conduction block 8 through which heat pipe conductors 9 (a–d) of which four are shown transfer heat between the conduction block 8 and the louvers 6.

It will be apparent that the structural fan-heatsink principle of the invention provides substantial heat transfer flexibility. All parts are susceptible to spring compression for improving heat transfer. The fan-heatsink cooling device is positionable in one example so that heat and moving media, radiating from a heat source such as a chip, can enter the louvered 6 housing through the inlets 7 near the central shaft 4 and out through the louvers 6. In another example the heat pipes 9 can be arranged to carry heat from the heat source such as a chip not visible under and in contact with the block 8, conducted through the conduction block 8 into or from the heat pipes 9(a–d) to and through the louvers. An advantage is that any ambient forced through the louvers 6 can absorb heat from or transfer heat to the louvers 6.

In certain applications it may be desirable to employ the fan-heatsink of the invention in the air stream of a system through using a diverter.

Figure 5:
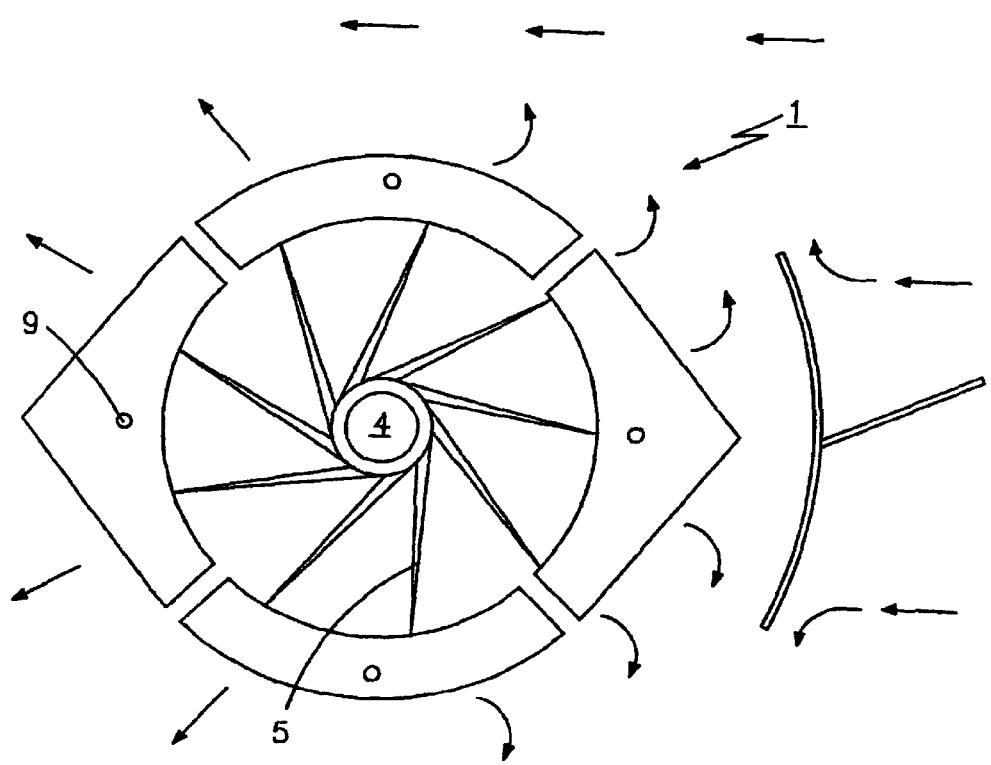
FIG. 5 is a top view of the fan-heatsink illustrating the influence of a diverter on the ambient flow.

Referring to FIG. 5 there is shown a top view of the fan-heatsink of the invention illustrating the influence of a diverter on the ambient flow. The overall shape of the fan-heatsink 1 is oval in this application. The central portion of the system stream will encounter an air flow diverter element 10 which will absorb the heat carried by the air flow coming out from the fan-heatsink 1. This heated air stream will then be mixed with the rest of the system air stream which will flow by both sides of the oval. The hot air flow coming out from the fan-heatsink 1 will then mix with this diverted system air stream. The heat carried by this mixed air stream will be exhausted out of the system. Thus the output of the fan-heatsink 1 will move into the system mainstream. The diverter element can be made of a solid or perforated plate and is usable in heat exchanging.

What has been described is a heat transfer technique wherein a fan in a louvered housing with heat pipes serving as a cooling device transfers a large amount of heat into an ambient while producing minimal acoustic noise.

What is claimed is:

1. In a rotating fan operable by rotation around a shaft of an impeller between essentially parallel top and bottom cover elements to force an ambient out of an egress aperture, the improvement comprising:

at least one of said cover elements having an ambient entry aperture through said element positioned in the vicinity of said impeller, and, a circular housing member surrounding the periphery of said impeller and made up of a plurality of fins serving as ambient egress, at least one heat pipe thermal transfer member extending from a heat source and in a direction parallel to said housing and through and in contact with each of said fins, and wherein each said heat pipe thermal transfer member has one end thereof at a thermal conduction block at said heat source, said shaft of said impeller extending between and through said cover elements comprising superimposed and separated top and bottom cover members, said shaft having blades extending radially a distance from said shaft and, said blades along said shaft are the distance between said superimposed and separated top and bottom cover members, inlet openings through said superimposed and separated top and bottom cover members in the portion of said superimposed and separated top and bottom cover members adjacent to said shaft and said circular housing member comprising a peripheral housing of fins having a dimension at least as long as the distance of said separation between said top and bottom members surrounding said impeller.

2. A heat transfer structure for transferring heat between an ambient and a source of heat comprising in combination:

an impeller shaft extending between and through superimposed and separated top and bottom cover members, said shaft having fins extending radially a distance from said shaft and said fins along said shaft are the distance between said top and bottom cover members, inlet openings through said cover members in the portion of said cover members adjacent to said shaft and a peripheral housing of louvers with a dimension at least as long as the distance of said separation between said top and bottom members surrounding said impeller.

3. The heat transfer structure of claim 2 including at least one heat pipe thermal transfer member extending from a heat source and in a direction parallel to said housing end through and in contact with each of said louvers.

4. The improvement of claim 3 wherein each said heat pipe thermal transfer member has one end thereof at a thermal conduction block at said heat source.

5. Omnidirectional heat transferring apparatus comprising:

a rotating fan operable by rotation around a shaft of an impeller between essentially parallel top and bottom cover elements to force an ambient out of an egress aperture, said top and bottom cover elements comprising superimposed and separated top and bottom cover members at least one of said cover members having an ambient entry aperture through said member positioned in the vicinity of said impeller, a circular housing member surrounding the periphery of said impeller and made up of a plurality of fins serving as an ambient egress, a thermal transfer block in contact with a chip heat source, said heat transfer block having thermal transfer to at least one heatpipe thermal transfer member extending from said block in a direction parallel to said housing and through and in contact with each of said fins, and wherein each said heat pipe thermal transfer member has one end thereof at a thermal conduction block at said chip heat source, said shaft of said impeller extending between and through said cover members comprising superimposed and separated top and bottom cover members, said shaft having blades extending radially a distance from said shaft and, said blades along said shaft are the distance between said superimposed and separated top and bottom cover members, inlet openings through said superimposed and separated top and bottom cover members in the portion of said superimposed and separated top and bottom cover members adjacent to said shaft and said circular housing member comprising a peripheral housing of fins having a dimension at least as long as the distance of said separation between said top and bottom members surrounding said impeller.

6. The omnidirectional heat transferring apparatus of claim 5 including said chip and said block being centered with respect to said housing.

* * * * *